(12) United States Patent
Kiel et al.

(10) Patent No.: US 10,734,361 B2
(45) Date of Patent: Aug. 4, 2020

(54) POWER SWITCHING MODULE, CONVERTER INTEGRATING THE LATTER AND MANUFACTURING METHOD

(71) Applicants: INSTITUT VEDECOM, Versailles (FR); ELVIA PCB, Coutances (FR)

(72) Inventors: Friedbald Kiel, Fontainebleau (FR); Olivier Belnoue, Ondreville-sur-Essonne (FR)

(73) Assignees: INSTITUT VEDECOM, Versailles (FR); ELVIA PCB, Coutances (FR)

( * ) Notice: Subject to any disclaimer, the term of this patent is extended or adjusted under 35 U.S.C. 154(b) by 0 days.

(21) Appl. No.: 16/468,259

(22) PCT Filed: Dec. 5, 2017

(86) PCT No.: PCT/FR2017/053404
§ 371 (c)(1),
(2) Date: Jun. 10, 2019

(87) PCT Pub. No.: WO2018/109318
PCT Pub. Date: Jun. 21, 2018

(65) Prior Publication Data
US 2020/0013755 A1   Jan. 9, 2020

(30) Foreign Application Priority Data
Dec. 12, 2016   (FR) .................... 16 62331

(51) Int. Cl.
*H01L 25/065*   (2006.01)
*H01L 23/473*   (2006.01)
(Continued)

(52) U.S. Cl.
CPC ........ *H01L 25/0657* (2013.01); *H01L 23/473* (2013.01); *H01L 23/481* (2013.01); *H01L 23/49838* (2013.01); *H02M 3/155* (2013.01)

(58) Field of Classification Search
None
See application file for complete search history.

(56) References Cited

U.S. PATENT DOCUMENTS

2001/0052641 A1* 12/2001 Kuo ................ H01L 23/49562
257/686
2002/0024129 A1*  2/2002 Hirahara ............. H01L 25/071
257/691
(Continued)

FOREIGN PATENT DOCUMENTS

DE    102014010373 A1   1/2015
EP      1411551 A1      4/2004
(Continued)

OTHER PUBLICATIONS

International Search Report for PCT/FR2017/053404 dated Mar. 28, 2018.
Written Opinion for PCT/FR2017/053404 dated Mar. 28, 2018.

*Primary Examiner* — Shaun M Campbell
(74) *Attorney, Agent, or Firm* — Sandberg Phoenix & von Gontard, P.C.

(57) ABSTRACT

The power switching module includes first and second subassemblies that are superimposed on top of each other to form a stack and that comprise first and second electronic power switches forming a bridging arm, respectively. The module comprises a metal central sheet (LW7) and first and second metal end sheets (LW2, LW12) forming top and bottom ends of the stack. According to the invention, the module also comprises first, second and third metal terminal rods (1, 2, 3) that extend through the stack and open onto at least one of the top and bottom ends thereof, the first, second and third rods being in electrical continuity with the first and second metal end sheets and the metal central sheet, respectively.

10 Claims, 4 Drawing Sheets

(51) Int. Cl.
*H01L 23/48* (2006.01)
*H01L 23/498* (2006.01)
*H02M 3/155* (2006.01)

(56) References Cited

U.S. PATENT DOCUMENTS

| | | | |
|---|---|---|---|
| 2012/0112366 A1* | 5/2012 | Crebier | H01L 21/823481 |
| | | | 257/777 |
| 2013/0221526 A1* | 8/2013 | Lange | H01L 24/24 |
| | | | 257/750 |
| 2014/0291849 A1 | 10/2014 | Otremba et al. | |
| 2014/0327127 A1* | 11/2014 | Hable | H01L 24/33 |
| | | | 257/712 |
| 2014/0367736 A1* | 12/2014 | Iizuka | H01L 25/072 |
| | | | 257/133 |
| 2015/0243638 A1 | 8/2015 | Matsuoka | |
| 2016/0133558 A1* | 5/2016 | Stahr | H01L 24/19 |
| | | | 257/692 |

FOREIGN PATENT DOCUMENTS

| | | |
|---|---|---|
| JP | 2010177453 A | 8/2010 |
| WO | 2016165843 A1 | 10/2016 |

\* cited by examiner

POWER SWITCHING MODULE, CONVERTER INTEGRATING THE LATTER AND MANUFACTURING METHOD

CROSS-REFERENCE TO RELATED APPLICATIONS

The present application is the US National Stage under 35 USC § 371 of International Application No. PCT/FR2017/053404, filed Dec. 5, 2017 which claims the priority to French application 1662331 filed on Dec. 12, 2016, the content of which (text, drawings and claims) is incorporated herein by reference.

BACKGROUND

The invention generally relates to the field of power electronics. More particularly, the invention relates to power switching modules and power converters incorporating such modules. The invention also relates to a method for manufacturing a power switching module.

The desired energy transition toward renewable energy sources producing lower $CO_2$ emissions places power electronics at the heart of current technological challenges. Energy conversion needs are present in almost all activity sectors, such as transportation, industry, lighting, heating, etc.

In the transportation field, the automotive industry, which is subject to very restrictive emissions standards regarding polluting discharges, is experiencing true technological change with vehicle electrification. Vehicle electrification, which is faced with the major weight, bulk and cost constraints that prevail in this mass production industry, requires technological advances in converters. Furthermore, the need for sufficient mileage autonomy for electric vehicles, or for hybrid vehicles in electric mode, is pushing hard toward increased operating voltage with the aim of reducing Joule losses related to the current, or toward manufacturing technologies that make it possible to increase low-voltage currents by parallelizing the components. The necessary technologies must make it possible to increase the compactness of the converters by increasing the cutoff frequency and reducing stray inductances.

Compromises must be struck in the converters in particular between the withstand voltage, the cutoff frequency, the maximum acceptable power density, the temperature, the reliability and the integration of new available materials.

Higher voltages oppose the compactness of the converters, since greater breakdown risks often require increased distances between components having different polarities. Higher switching frequencies are favorable to compactness but increase the switching losses and the power dissipated by the components and require a significant reduction of the stray inductive and capacitive elements. The maximum power density acceptable by the components limits the amplitude of the switched currents in order to keep the junction temperatures below critical values. High-performing cooling devices are necessary in order to maintain the heat balance of the converters and extract the dissipated energy as close as possible to the components. These high-performing cooling devices are essential for greater compactness and reliability.

The various constraints applicable to the converters have steered designers toward a modular architecture based on the combination of elementary power switching modules.

Two examples of elementary power switching modules are shown in FIGS. 1a and 1b. As shown in FIGS. 1a and 1b, these elementary modules are formed by a transistor switching bridge, or half-bridge, arm. The bridge arm conventionally comprises a high side transistor and a low side transistor, and associated diodes. FIG. 1a shows a diagram of a first bridge arm BM made up of MOSFET transistors, $MT_{HS}$ and $MT_{LS}$, and diodes $MD_{HS}$ and $MD_{LS}$ respectively associated with the transistors. FIG. 1b shows a diagram of a second bridge arm BI made up of IGBT transistors, $IT_{HS}$ and $IT_{LS}$, and their associated diodes $ID_{HS}$ and $ID_{LS}$.

These elementary power switching modules can be combined to form complete switching bridges or combined in parallel to pass the desired current.

Furthermore, it is known to stack circuit subassemblies to produce 3D architectures. Thus, application EP 1,411,551 A1 proposes a power module comprising a central connecting plate, top and bottom electrode plates and electronic switching components that are sandwiched between the central connecting plate and the top and bottom electrode plates. Application DE102014010373A1 teaches an electronic module having first and second printed circuit boards that are superimposed and each include an electronic component. A sintering method is used to connect the boards together.

Today, it appears desirable to propose a new solution suitable for mass production and allowing a better compromise between the different constraints applicable to electric power converters.

BRIEF SUMMARY

According to a first aspect, a power switching module is disclosed having first and second subassemblies that are superimposed on top of each other to form a stack and respectively comprising first and second electronic power switches forming a bridge arm, the module comprising a metal central sheet at the junction of the first and second subassemblies and first and second metal end sheets forming top and bottom ends of the stack, the first and second metal end sheets being arranged in parallel and symmetrically relative to the central metal sheet and being able to be brought to first and second supply voltages of the bridge arm, and the central metal sheet being able to deliver a chopped voltage produced in the module. The module also comprises first, second and third metal terminal rods that extend in the stack and emerge through at least one of the top and bottom ends of the stack, these first, second and third metal terminal rods being in electrical continuity respectively with the first and second metal end sheets and the central metal sheet.

According to one particular feature, at least one of the first, second and third metal terminal rods is mechanically and electrically connected to the corresponding one of the first and second metal end sheets and central metal sheet by a forced assembly or forced assembly with a temperature gradient.

According to another particular feature, the module also comprises first and second metal shielding sheets that are pressed against the first and second metal end sheets through first and second electrical insulation layers, respectively, the first and second metal shielding sheets being able to be placed at an intermediate voltage between the first and second supply voltages.

According to still another particular feature, the module comprises at least one electrical connection terminal having a coaxial metal part forming shielding comprised in the first and/or second metal shielding sheet(s), one said metal terminal rod associated with the terminal emerging in the coaxial metal part forming shielding so as to form a coaxial electrical connecting terminal.

According to still another particular feature, the module comprises first, second and third coaxial electrical connection terminals formed in the first and second metal shielding sheets and in which the first, second and third metal rods respectively emerge.

According to still another particular feature, the first and second subassemblies are of the so-called IMS type and have a lamination of different conductive and dielectric layers, the module being of the press assembly type with or without application of a temperature gradient.

According to one particular embodiment, the module comprises a central space for circulation of cooling liquid located between the first and second subassemblies.

According to another particular embodiment, the module also comprises top and bottom cooling liquid circulation spaces respectively located near top and bottom ends.

According to still another particular feature, the electronic power switches are transistors of the MOSFET or IBGT type.

According to another aspect, an electric power converter is disclosed comprising at least one module as briefly described above.

BRIEF DESCRIPTION OF THE FIGURES

Other advantages and features will appear more clearly upon reading the detailed description below of several specific embodiments of the invention, in reference to the appended drawings, in which:

FIG. 5 is an exploded view showing the laminated architecture of a module according to FIG. 4a.

DETAILED DESCRIPTION

Figure 2:
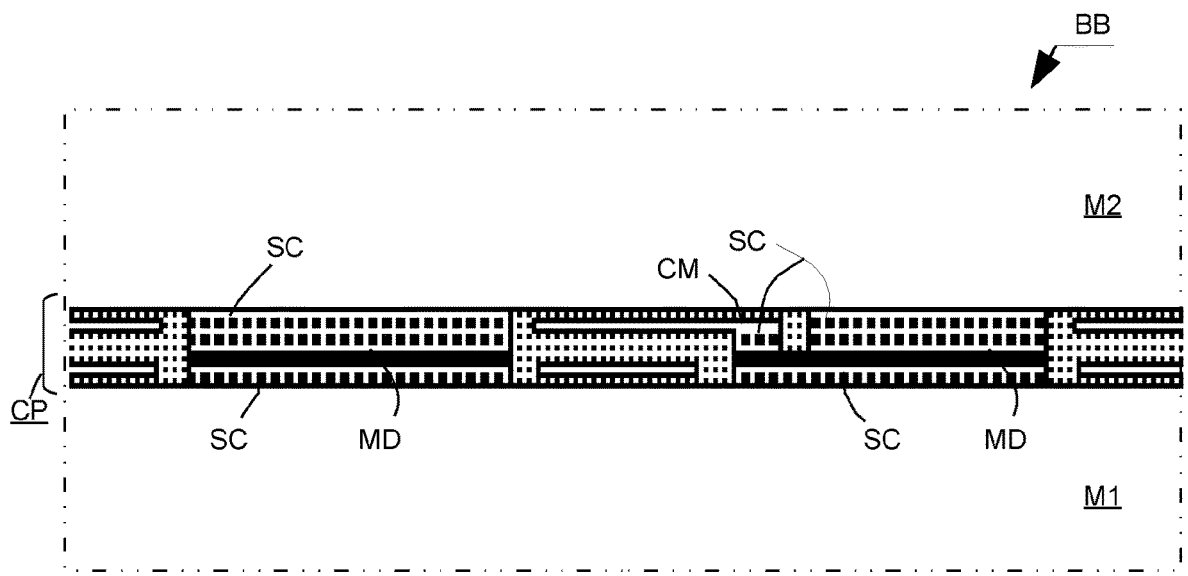
FIG. 2 is a simplified sectional view showing the typography of a basic component included in the composition of a module according to the invention.
Figure 3A:
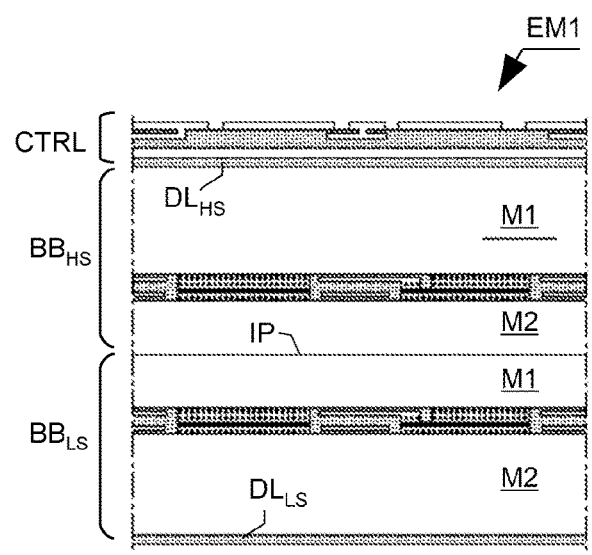
FIGS. 3a and 3b are simplified sectional views showing the typographies of first and second embodiments of a module according to the invention, for a module with cooling by air and a module with liquid cooling.
Figure 3B:
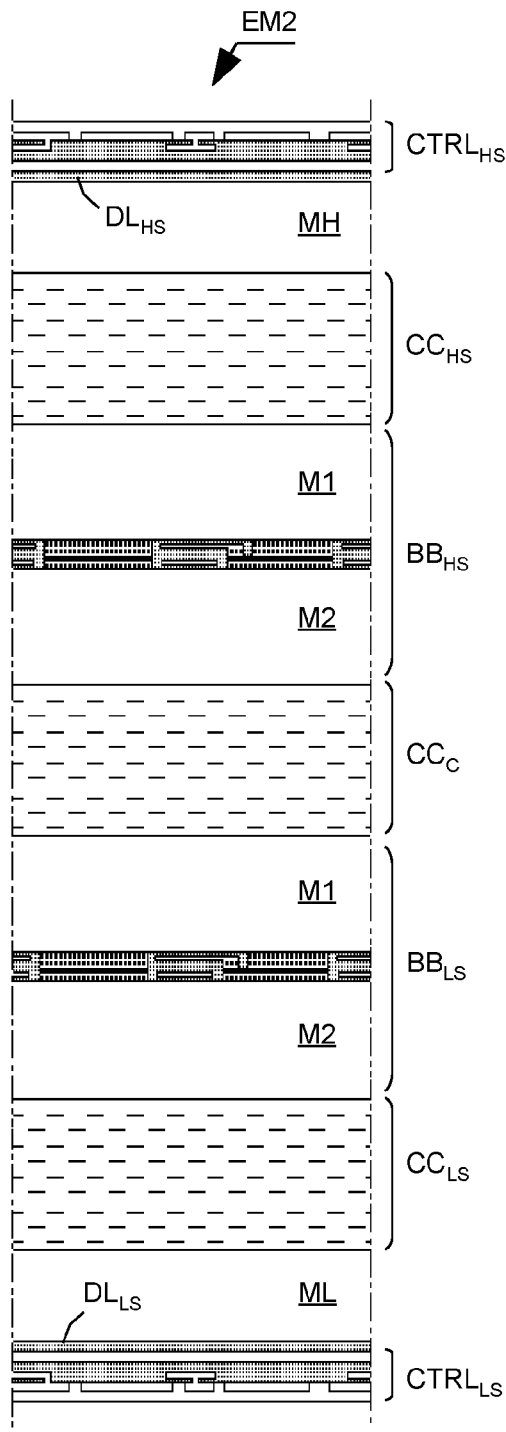

The general principles of arrangement and the typographies of two particular embodiments of an elementary power switching module according to the invention are described in reference to FIGS. 2, 3a and 3b as an example.

Figure 1A:
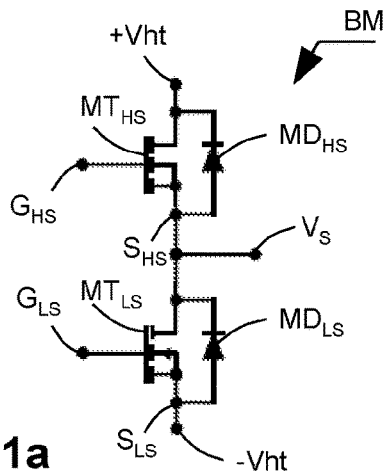
FIGS. 1a and 1b show two diagrams of transistor bridge arms, with MOSFET transistors and IGBT transistors.
Figure 1B:
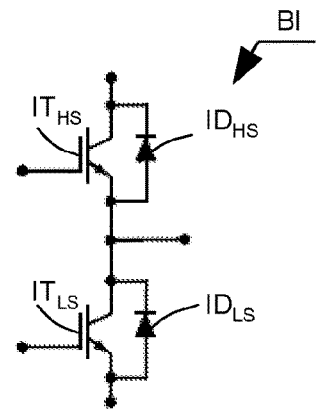

In the description below, it is considered that the elementary module is a bridge arm BM as shown in FIG. 1a, i.e., comprising two MOSFET transistors $MT_{HS}$ and $MT_{LS}$. This description also applies to the bridge arm BI of FIG. 1b by replacing the MOSFET transistors with IGBT transistors.

FIG. 2 shows the typography of a basic component BB comprising a transistor MT of the bridge arm BM. The implantation of the associated diode MD is also shown in FIG. 2. It will be noted, however, that in certain configurations, this diode MD connected between the drain and the source of the transistor will be integrated into the chip thereof, such that its implantation shown in FIG. 2 will prove unnecessary.

According to the invention, two basic components BB are stacked to form the bridge arm BM of the elementary module. This construction is made possible by the fact that the bridge arm has a symmetry of components and connector technology between its high side and its low side. Conversely, this construction with stacking of two basic components requires the particular arrangements provided in the present invention described below, to facilitate the discharge of dissipated heat and to allow the module to achieve thermal equilibrium.

As shown in FIG. 2, the basic unit BB includes a component part CP sandwiched between two metal parts M1 and M2 that are typically made from copper. Such a construction greatly facilitates the discharge of the dissipated heat from the part CP due to the masses of copper with a high thermal conductivity present on either side of the component part CP.

In general, it will be noted that in the invention, power electronics manufacturing techniques are used that are well known and mastered and that are essentially derived from IMS (Insulated Metal Substrate) technology. Thus, to produce an elementary module according to the invention, it is possible to use a combination of different manufacturing techniques comprising lamination, photolithography, metal electrodeposition, wet etching and others. For the welding of the components, it is possible to use transitional liquid phase (TLP) welding, metal nanoparticle powder sintering or diffusion welding.

In the example of FIG. 2, during the production of the component part CP by lamination, the transistor MT and the diode MD are welded to the copper metal parts M1 and M2 for example using a silver welding preform SC represented by thick dots.

The bottom faces of the chips MT and MD interconnected to the metal part M1 correspond respectively to a transistor source and a diode anode MD, in this embodiment. The metal part M1 here corresponds to the source interconnection point referenced S ($S_{HS}$ or $S_{LS}$) in FIG. 1a.

The top faces of the chips MT and MD welded to the metal part M2 correspond respectively to a transistor drain and a diode cathode MD, in this embodiment. The metal part M2 here corresponds to the drain interconnection point referenced as D ($D_{HS}$ or $D_{LS}$) in FIG. 1a. The upper face of the chip MT also has a part corresponding to the gate of the transistor and which is welded to a copper tape CM. This copper tape CM here corresponds to the gate interconnect point referenced as G ($G_{HS}$ or $G_{LS}$) in FIG. 1a.

The parts represented by thin dots in FIG. 2 correspond to electrically insulated dielectric portions, which are for example made with insulating films pre-impregnated with an epoxy-type polymerizable adhesive resin. The insulating dielectric layer on a metal part forming a substrate or metal base, like the part M1 or M2, can be deposited beforehand on the contact plane of the copper base and next chemically etched to obtain the desired pattern.

The inter-layer copper tapes, like the tape CM, are typically obtained by wet etching of a copper foil.

In this example, the final assembly operation is done in a press with the application of a temperature gradient and is done on the assembly formed by the two stacked components BB. This assembly can also be done by a transitional liquid phase bonding called TLP welding. The welding operations and the polymerization of the resin-based dielectrics are obtained during this assembly.

First and second specific embodiments EM1 and EM2 of a basic power switching module according to the invention are shown in FIGS. 3a and 3b.

The elementary module EM1 shown in FIG. 3a is an air-cooled embodiment. The converter formed by the assembly of several elementary modules EM1 can be equipped, if necessary, with heat sink means. The heat sink means will include one or several radiators in electrically insulated thermal contact with the copper parts M1, M2. The architecture of the invention allows an effective extraction of the dissipated heat with conventional radiators, thus avoiding the use of more expensive means, such as phase change cooling devices, in a certain number of applications.

The mechanical and electrical connection at the junction plane IP between the components $BB_{LS}$ and $BB_{HS}$ of FIG. 3a can be obtained by a sintering bond during the final assembly operation or by other welding techniques indicated above.

As shown in FIG. 3a, the elementary module EM1 is equipped here with a control circuit CTRL arranged in the top part of the module and electrically insulated, by a dielectric layer $DL_{HS}$, from the copper part M1 of the component $BB_{HS}$. A dielectric layer $DL_{LS}$ is arranged in the lower bottom part of the module and provides electrical insulation of this part of the component $BB_{LS}$. The circuit CTRL has several laminated layers made using the techniques described above. Active and passive components may, if necessary, be embedded between the internal layers of the circuit CTRL, or implanted on the surface on the circuit conventionally by brazing or conductive glue.

The elementary module EM2 shown in FIG. 3a is liquid-cooled embodiment that is suitable for high-power applications.

Aside from the components $BB_{LS}$ and $BB_{HS}$ and control circuits $CTRL_{HS}$ and $CTRL_{LS}$ arranged on the top and bottom parts of the module, similarly to the control circuit CTRL of FIG. 3a, the elementary module EM2 also comprises cooling liquid circulation spaces $CC_C$, $CC_{HS}$ and $CC_{LS}$. A pressurized dielectric cooling liquid may for example be used as heat transfer cooling liquid.

The space $CC_C$ is provided in the central part of the module EM2, in direct contact with the copper parts M1 and M2 of the components $BB_{LS}$ and $BB_{HS}$, respectively, and may have a volume larger than that of the spaces $CC_{HS}$ and $CC_{LS}$, in light of a greater thermal confinement of the central part.

The spaces $CC_{HS}$ and $CC_{LS}$ are respectively provided on the top and bottom parts of the module EM2. The space $CC_{HS}$ is in direct contact with the copper part M1 of the component $BB_{HS}$ and a copper part MH inserted between the space $CC_{HS}$ and the dielectric layer $DL_{HS}$ that provides electrical insulation with the circuit $CTRL_{HS}$. The space $CC_{LS}$ is in direct contact with the copper part M2 of the component $BB_{LS}$ and a copper part ML inserted between the space $CC_{LS}$ in the dielectric layer $DL_{LS}$ that provides electrical insulation with the circuit $CTRL_{LS}$.

A third embodiment, not shown, of an elementary power module that is intermediate relative to the modules EM1 and EM2 will comprise a single cooling liquid circulation space, such as $CC_C$, in the central part of the module.

Figure 4A:
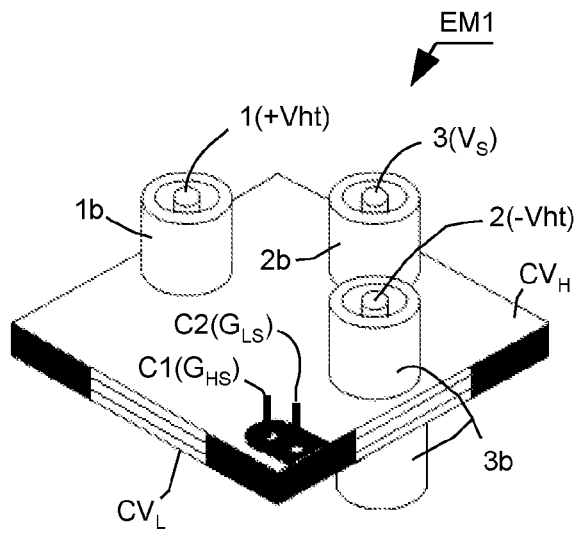
FIGS. 4a and 4b are external views of modules according to the first and second embodiments of FIGS. 3a and 3b.
Figure 4B:
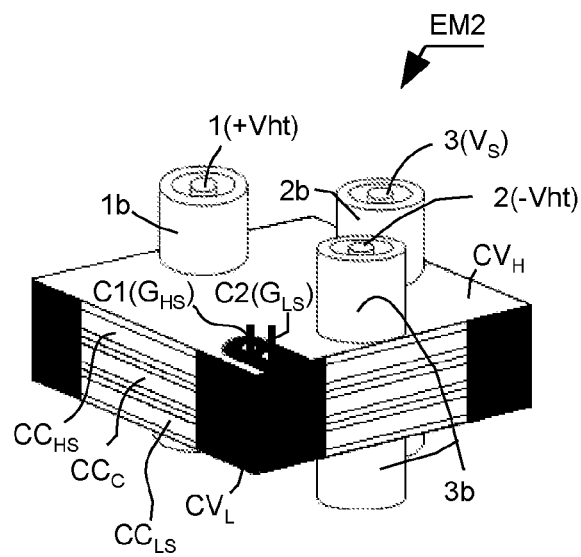

FIGS. 4a and 4b show outside perspective views of the elementary modules EM1 and EM2. The blackened parts shown in these figures correspond to resinous parts having electrical insulation, mechanical assembly and sealing functions in particular in the case of the module EM2.

The embodiments of FIGS. 4a and 4b have a coaxial connector technology with a shielding allowing a reduction in stray inductances. As shown in these figures, the modules EM1 and EM2 comprise external sheets $CV_H$, $CV_L$ that are made from copper and that support terminals.

Terminals 1 and 2 respectively receive positive +Vht and negative −Vht voltages (cf. FIG. 1a) that are applied to the elementary module EM1, EM2. The terminal 3 delivers a chopped voltage $V_S$ (cf. FIG. 1a) with frequency corresponding to that of the switching control signals that are applied on the gates $G_{HS}$ and $G_{LS}$ (cf. FIG. 1a) of the transistors. Signal pins C1 and C2 shown in FIGS. 4a and 4c are connected to the gates $G_{HS}$ and $G_{LS}$ of the transistors.

The coaxial terminals 1, 2 and 3 shown in the top part of the elementary module EM1, EM2 are also present on the bottom part of the module. The coaxial shielding parts 1b, 2b and 3b of the terminals 1, 2 and 3 are made from copper and form a monobloc assembly with the outer sheet of copper terminals $CV_H$, $CV_L$.

It will be noted that if necessary, the sheets $CV_H$, $CV_L$ and the coaxial shielding parts 1b, 2b and 3b will be placed at an intermediate potential between the voltages +Vht and −Vht so as to avoid electrical breakdowns when the difference in potential between these voltages is large, for example in high voltage. Typically, this intermediate potential is substantially equal to 2Vht/2.

As shown in FIG. 4b, the cooling liquid circulation spaces $CC_C$, $CC_{HS}$ and $CC_{LS}$ emerge on all four flanks of the elementary module EM2. This arrangement allows a continuity of the spaces $CC_C$, $CC_{HS}$ and $CC_{LS}$ in a set of several elementary modules EM2 assembled by their flanks.

The production of liquid cooling converters for any number of phases is thus made possible by such an assembly of elementary modules according to the invention. It will be noted that the preceding applies to the different embodiments of the module according to the invention and in particular to the module EM1.

Control circuits CTRL, as shown in FIGS. 3a and 3b, will be arranged if necessary on the outer sheets of copper terminals $CV_H$, $CV_L$ after the deposition of an electrically insulating layer.

Figure 5:
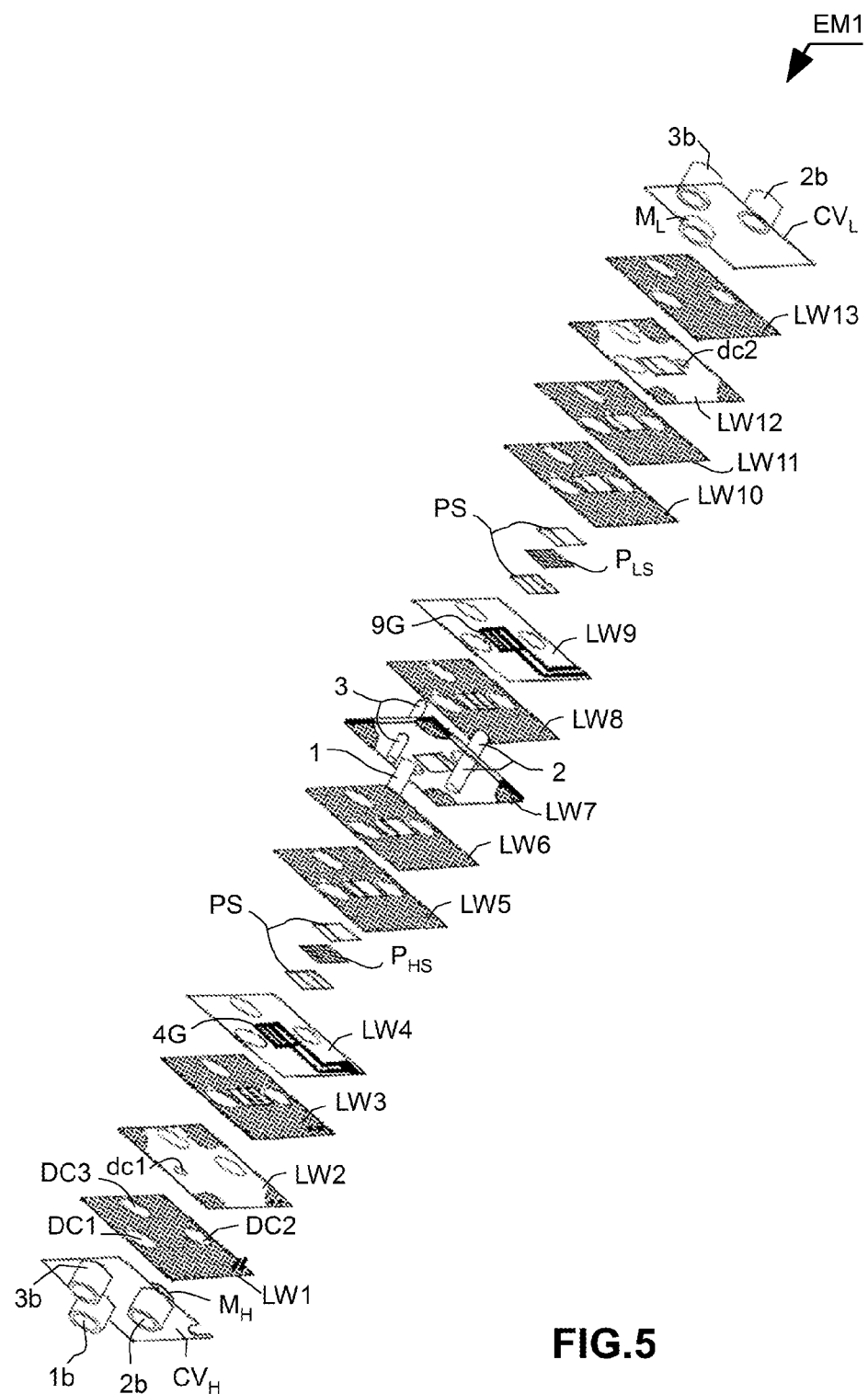
Figure 6:
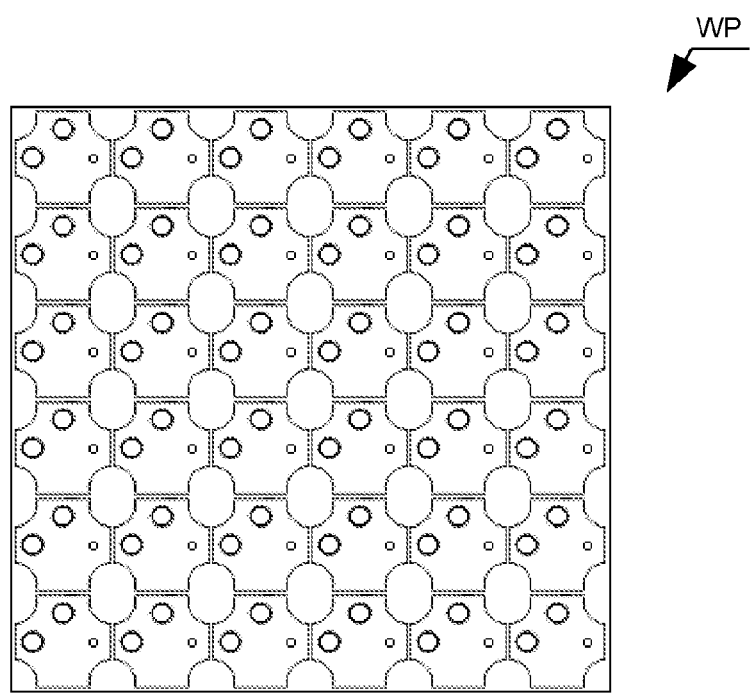
FIG. 6 is a front view showing a work panel used in the manufacturing of a module according to the invention.

In reference to FIGS. 5 and 6, we will now describe the manufacture of elementary modules according to the invention and the arrangement of the different internal layers.

FIG. 5 shows, in exploded view, the different elements and stacked sheets necessary to manufacture an elementary module of type EM1 described above.

As shown in FIG. 5, several sheets and insulating films LW1 to LW13, and transistor chips $P_{HS}$ and $P_{LS}$, are stacked between the external sheets of copper terminals $CV_H$ and $CV_L$. The sheets and insulating films all have the rectangular shape of the modules EM1, EM2.

The elements LW1, LW3, LW5, LW6, LW8, LW10, LW11 and LW13 are typically thin insulating films for example including epoxy resin, a derivative of epoxy resin or, if necessary, will be made using PI technology with glass fiber and a thermoplastic resin. All three insulating films have circular cutouts DC1, DC2 and DC3 of equal diameter, provided for the passage of copper rods of the connecting terminals 1, 2 and 3, respectively. It will be noted that the circular cutouts DC1, DC2 and DC3 are only identified on the film LW1 and have the same arrangement for the other films in sheets.

The films LW3, LW5, LW6, LW8, LW10 and LW13 also include central cutouts for the connecting circuit of the chips $P_{HS}$ and $P_{LS}$, the connecting circuit being described above in reference to FIG. 2. It will be noted that in this embodiment, the chips $P_{HS}$, $P_{LS}$ each comprise both components, namely, the transistor and its associated diode. In other embodiments, the two components will be integrated into a same active chip.

The elements LW4 and LW9 are printed circuit sheets including copper patterns 4G and 9G for the connection of the chips $P_{HS}$ and $P_{LS}$ and in particular their gates, respectively. These sheets LW4 and LW9, as well as the insulating films, include three circular cutouts DC1, DC2 and DC3 for the passage of the copper rods of the connecting terminals 1, 2 and 3.

The elements LW2 and LW12 are copper sheets respectively corresponding to the copper parts M1 and M2 of the components $BB_{HS}$ and $BB_{LS}$ of the topology shown in FIG. 3a. The sheet LW2 must be electrically connected with the terminal rod 1 and is intended to be connected to the voltage +Vht. The sheet LW12 must be electrically connected with the terminal rod 2 and is intended to be connected to the voltage −Vht.

The central element LW7 is a copper sheet corresponding to the copper central part of the topology shown in FIG. 3a, the central part being formed by the IP junction of the parts M2 and M1 of the components $BB_{HS}$ and $BB_{LS}$, respectively. The sheet LW4 is connected to the output terminal 3 by which the chopped voltage $V_S$ is delivered. As shown in FIG. 5, the terminal rod 3 is secured to the sheet LW4 and in electrical conduction therewith.

The terminal rods 1 and 2 pass through the central sheet LW7, without coming into contact therewith, by the circular cutouts DC1 and DC2. As indicated above, the terminal rods 1 and 2 must be in electrical contact, once the elementary module is assembled, with the sheets LW2 and LW12, respectively. The electrical contact between the terminal rods 1 and 2 and their associated sheets LW2 and LW12 is obtained by forced assembly.

The final assembly done in a press allows the production of the forced assembly, which can be made easier by the application of a temperature gradient. This forced assembly is obtained owing to the orifices dc1 and dc2, which have a diameter smaller than that of the terminal rods 1 and 2, provided in the associated sheets LW2 and LW12, respectively. It will be noted that the forced assembly participates in the mechanical bonding of the laminated assembly sandwiched between the copper sheets LW2 and LW12, and $CV_H$ and $CV_L$. It will be noted that the mechanical bonding of the module is also provided by the terminal rods 1, 2 and 3 that are inserted and gripped in insulating sleeves housed inside coaxial shieldings 1b, 2b and 3b. After polymerization, the insulating films impregnated with resin complete the mechanical bonding of the module. As shown in FIG. 5, the four corners of the sheets LW2, LW7 and LW12 are resinous to promote the attachment and mechanical holding. The insulating sleeves $M_L$ and $M_H$ housed inside the coaxial shieldings 1b and 2b extend past internal surface planes of the external sheets $CV_L$ and $CV_H$, respectively, for positioning indexing of the sheets and films of the internal layers and the electrical insulation.

The chips $P_{HS}$ and $P_{LS}$ are fastened in electrical continuity on the corresponding sheets using welding preforms PS that are arranged on either side of the chips. Cavities and disconnects are arranged in the sheets to contain the chips and the weld and to form the electrical circuit.

To produce an embodiment with cooling liquid circulation spaces, like the module EM2, it may prove necessary to provide additional copper sheets to create the spaces. It is also possible to use terminal rods with several diameters in order to obtain shoulders. The shoulders will serve to guarantee a desired spacing between facing sheets forming the walls of the spaces. The shoulders can also perform a pushing function to bring the various sheets to their places during the final assembly of the module. In a variant, it can also be possible to use spacer elements, for example, welded on the sheets.

The architecture of the elementary modules according to the invention has been designed to allow low-cost manufacturing.

The sheets and insulating films of the elementary modules can be manufactured in parallel, using several work panels WP like that shown in FIG. 6. The panel WP shown in FIG. 6 is that used to manufacture the sheets LW2 or LW12 and is shown at an intermediate stage of the manufacturing process. When the process is completed, a mechanical, thermal or other cutting operation is performed to obtain a plurality of sheets.

The production line will therefore comprise several parallel production units working on the different panels that will in turn be able to supply several production units in parallel with the modules. It will be noted that the typologies of the modules according to the present invention, formed from elementary components, lend themselves to more in-depth parallelization of the manufacturing. Substantial volume effects can be obtained by increasing the number of identical component elements and reduce the manufacturing costs.

The invention is not limited to the specific embodiments that have been described here as an example. Depending on the applications of the invention, one skilled in the art can provide various changes and variants that fall within the scope of the appended claims.

The invention claimed is:

1. A power switching module having first and second subassemblies that are superimposed on top of each other to form a stack and respectively comprising first and second electronic power switches forming a bridge arm, the power switching module comprising a metal central sheet at the junction of the first and second subassemblies and first and second metal end sheets forming top and bottom ends of the stack, the first and second metal end sheets being arranged parallel and symmetrically relative to the central metal sheet and being able to be brought to first and second supply voltages (+Vht, −Vht) of said bridge arm, and said central metal sheet being able to deliver a chopped voltage ($V_S$) produced in said module, said power switching module further comprising first, second and third metal terminal rods that extend in the stack and emerge through at least one of the top and bottom ends of the stack, these first, second and third metal terminal rods being in electrical continuity respectively with the first and second metal end sheets and the central metal sheet.

2. The power switching module according to claim 1, wherein at least one of said first, second and third metal terminal rods is mechanically and electrically connected to the corresponding one of said first and second metal end sheets and central metal sheet by a force fitting or force fitting with a temperature gradient.

3. The power switching module according to claim 1, wherein the power switching module also comprises first and second metal shielding sheets that are pressed against said first and second metal end sheets through first and second electrical insulation layers, respectively, the first and second metal shielding sheets being able to be placed at an intermediate voltage between the first and second supply voltages (+Vht, −Vht).

4. The power switching module according to claim 3, it wherein the power switching module comprises at least one electrical connection terminal having a coaxial metal part forming shielding comprised in the first and/or second metal shielding sheet(s), one of said metal terminal rods associated with the terminal emerging in the coaxial metal part forming shielding so as to form a coaxial electrical connecting terminal.

5. The power switching module according to claim 4, wherein the power switching module comprises first, second and third coaxial electrical connection terminals formed in said first and second metal shielding sheets and in which said first, second and third metal rods respectively emerge.

6. The power switching module according to claim 1, wherein said first and second subassemblies are of the insulated metal substrate (IMS) type and have a lamination of different conductive and dielectric layers, said power switching module being of the press assembly type with or without application of a temperature gradient.

7. The power switching module according to claim 1, wherein the power switching module also comprises a central space for circulation of cooling liquid located between said first and second subassemblies.

8. The power switching module according to claim 1, wherein the power switching module comprises top and bottom cooling liquid circulation spaces respectively located near top and bottom ends.

9. The power switching module according to claim 1, wherein said electronic power switches are MOSFET or IBGT type transistors.

10. An electric power converter comprising at least one power switching module according to claim 1.

* * * * *